United States Patent [19]

Ueda et al.

[11] Patent Number: 5,064,706
[45] Date of Patent: Nov. 12, 1991

[54] CARRIER TAPE INCLUDING MOLTEN RESIN FLOW PATH ELEMENT FOR RESIN PACKAGED SEMICONDUCTOR DEVICES

[75] Inventors: Tetsuya Ueda; Haruo Shimamoto; Hideya Yagoura; Hiroshi Seki; Yasuhiro Teraoka, all of Itami, Japan

[73] Assignee: Mitsubishi Denki Kabushiki Kaisha, Japan

[21] Appl. No.: 281,401

[22] Filed: Dec. 8, 1988

[30] Foreign Application Priority Data

Dec. 11, 1987 [JP] Japan ................... 62-314458

[51] Int. Cl.⁵ .................. B32B 3/10; H01L 21/56
[52] U.S. Cl. ................... 428/131; 428/901; 428/906; 428/134; 428/137; 174/52.4; 357/70; 437/206; 437/207; 437/217; 437/220
[58] Field of Search ............... 428/131, 901, 906, 134, 428/137; 174/52.4; 357/70; 437/206, 207, 217, 220

[56] References Cited

U.S. PATENT DOCUMENTS 4,049,903  9/1977  Kobler ................... 437/206 X
4,259,436  3/1981  Tabuchi et al. ............ 437/217 X
4,763,409  8/1988  Takekawa et al. ........... 357/70 X

FOREIGN PATENT DOCUMENTS 0149764  12/1978  Japan ................... 437/206
0030895   3/1980  Japan ................... 437/206
0009131   1/1985  Japan ................... 437/207
0004263   1/1986  Japan ................... 437/207

Primary Examiner—Ellis P. Robinson
Assistant Examiner—William P. Watkins, III
Attorney, Agent, or Firm—Leydig, Voit & Mayer

[57] ABSTRACT

A carrier tape includes a film having an opening for receiving a semiconductor chip to be resin-molded by a pair of mold halves and outer lead holes formed around the periphery of the opening, a plurality of leads for mounting the semiconductor chip on the film, and a resin running portion cooperating, when the mold halves are closed with the film held between the mold halves, with a gate formed on a parting surface of one of the mold halves to define a resin running path which extends from a portion of the film outside the outer lead holes to the opening for guiding a molten resin into the mold halves while preventing the resin from entering the outer lead holes.

1 Claim, 7 Drawing Sheets

CARRIER TAPE INCLUDING MOLTEN RESIN FLOW PATH ELEMENT FOR RESIN PACKAGED SEMICONDUCTOR DEVICES

BACKGROUND OF THE INVENTION

1. Field of the Invention

The present invention relates to a carrier tape on which a number of semiconductor chips are bonded in a process of manufacturing semiconductor devices and to a method for resin-molding semiconductor chips using the carrier tape.

2. Description of the Related Art

A tape automated bonding (T. A. B.) method, which uses a tape carrier, has recently been adopted for bonding electrodes of semiconductor integrated circuits in place of the wire bonding method.

FIGS. 4A and 4B illustrate a conventional carrier tape, on which a semiconductor chip 3 is mounted, used in the T. A. B. method. The carrier tape has a flexible film 1 made of an insulating material such as plastic, e.g., polyimide resin, and leads 7 made of a conductive material such as copper. The film 1 has perforations 2 regularly disposed at equal intervals along its opposite sides, a rectangular opening 4 formed at its center and called a center device hole, and outer lead holes 6 formed around the periphery of the opening 4. The leads 7 are supported by a support portion 9 defined between the opening 4 and the outer lead holes 6. The tips of the leads 7 extend into the opening 4 and serve as inner leads 7a. Central portions of the leads 7 are positioned above the outer lead holes 6 and serve as outer leads 7b. The rear ends of the leads 7 are formed as test pads 7c. A semiconductor chip 3 is connected to the inner leads 7a of the leads 7 through the medium of bumps 8 (FIG. 4B).

In such a carrier tape, bridging portions 5 are formed between adjacent outer lead holes 6 to secure the support portions 9 to the outer or remaining portion of the film 1 whereby the inner leads 7a are supported on the support portions 9 to be positioned in place with high accuracy.

A conventional process of manufacturing this type of semiconductor device will be described below.

As shown in FIGS. 5A and 5B, the semiconductor chip 3 is first introduced into the opening 4 of the film 1, and the bumps 8 provided on electrodes of the semiconductor chip 3 are connected to the inner leads 7a in a thermocompression bonding method. Subsequently, resin-molding of the semiconductor chip 3 is carried out to provide a resin-molded semiconductor device.

Generally, such a semiconductor chip 3 is resin-molded by the following methods.

In a first method called a potting molding method, as shown in FIGS. 6A and 6B, a liquid resin 14 is forced to flow out of the tip of a nozzle 13 to cover the semiconductor chip 3 which is mounted on a carrier tape and the area adjacent the chip. Since this method utilizes no mold, however, it is impossible to make the shape and size of the thus formed resin package uniform. Furthermore, since the liquid resin 14 is used, this method has the disadvantage that the moisture included in the resin 14 may adversely affect the semiconductor chip 3.

FIGS. 7A to 7D show a second method for resin-molding a semiconductor chip 3. After leads 7 are cut at certain portions thereof between their outer leads 7b and test pads 7c and a film 1 is cut at bridging portions 5 thereof, the outer leads 7b are connected to a lead frame 15 as shown in FIGS. 7A and 7B. The semiconductor chip 3 is then accommodated in a cavity 12 formed between a pair of mold halves 10 and 11 as shown in FIG. 7C. Subsequently, a resin 14 is introduced into the cavity 12 through a gate 16 defined between the upper mold half 10 and the lead frame 15 by a low pressure transfer molding method, whereby a resin-molded semiconductor device is produced as shown in FIG. 7D. Since the semiconductor chip 3 is, however, resin-molded together with a part of the lead frame 15 in the second method, the thickness of the resin package becomes undesirably large.

A third method for resin-molding a semiconductor chip 3 is illustrated in FIGS. 8A to 8C.

In this third method, a carrier tape, such as shown in FIG. 8A, is directly held between a pair of upper and lower mold halves 10 and 11, and a semiconductor chip 3 is accommodated in a cavity 12 in the lower mold half 11 as shown in FIG. 8B. A resin 14 in the form of an epoxy resin is then injected into the cavity 12 through a gate 16 defined above one 6a of the outer lead holes 6 by means of a low pressure transfer molding method, whereby a resin-molded semiconductor device is produced as shown in FIG. 8C.

In this case, however, the resin 14 is introduced into the cavity 12 through the outer lead hole 6a along an arrow A shown in FIG. 8A. That is, the resin 14 is supplied to not only the cavity 12 but also the outer lead hole 6a of the film 1 so that resin burrs 14a are formed in the outer lead hole 6a as shown in FIG. 8C. For this reason, it is necessary to remove the resin burrs 14a after resin-molding the semiconductor chip 3. As a result, the process of manufacturing semiconductor devices becomes complicated. In addition, the thin outer leads 7b, which have a thickness of about 35 μm, are easily damaged when the resin burrs 14a are removed, thereby reducing the reliability of the semiconductor devices.

SUMMARY OF THE INVENTION

In view of the above-described problem of the conventional art, an object of the present invention is to provide a carrier tape by which a semiconductor device having high reliability can be produced in a simple way with high productivity.

Another object of the present invention is to provide a method for resin-molding a semiconductor chip using this type of carrier tape.

According to one aspect of the present invention, a carrier tape comprises:

a film having an opening for receiving a semiconductor chip to be resin-molded by a pair of mold halves and outer lead holes formed around the periphery of the opening, the semiconductor chip having a plurality of electrodes, the mold halves having a pair of confronting parting surfaces one of which is provided with a gate;

a plurality of leads each having one end fixed on the film and the other end extending over a corresponding one of the outer lead holes into the opening for connection to one of the electrodes of the semiconductor chip; and a resin running portion cooperating, when the mold halves are closed with the film held between the mold halves, with the gate formed on the parting surface of one of the mold halves to define a resin running path which extends from a portion of the film outside the outer lead holes to the opening for guiding a molten resin into the mold halves while preventing the resin from entering the outer lead holes.

According to another aspect of the present invention, a method for resin-molding a semiconductor chip using a carrier tape and a mold, the carrier tape comprising a film having an opening in which the semiconductor chip is disposed and outer lead holes formed around the periphery of the opening and a plurality of leads for mounting the semiconductor chip on the film, the mold including a pair of mold halves having a pair of parting surfaces confronting each other, one of the parting surfaces having a gate, the method comprising the steps of:

positioning the semiconductor chip mounted on the film between a pair of mold halves;

closing the mold halves to sandwich the film between the parting surfaces of the mold halves to form a resin running path between the gate formed on the parting surface of one of the mold halves and the adjacent surface of the film other than the outer lead holes;

injecting a molten resin into the pair of mold halves through the resin running path; and solidifying the resin.

DESCRIPTION OF THE PREFERRED EMBODIMENT

Referring now to the accompanying drawings, a description will be given of a few preferred embodiments of the present invention.

Figure 1:
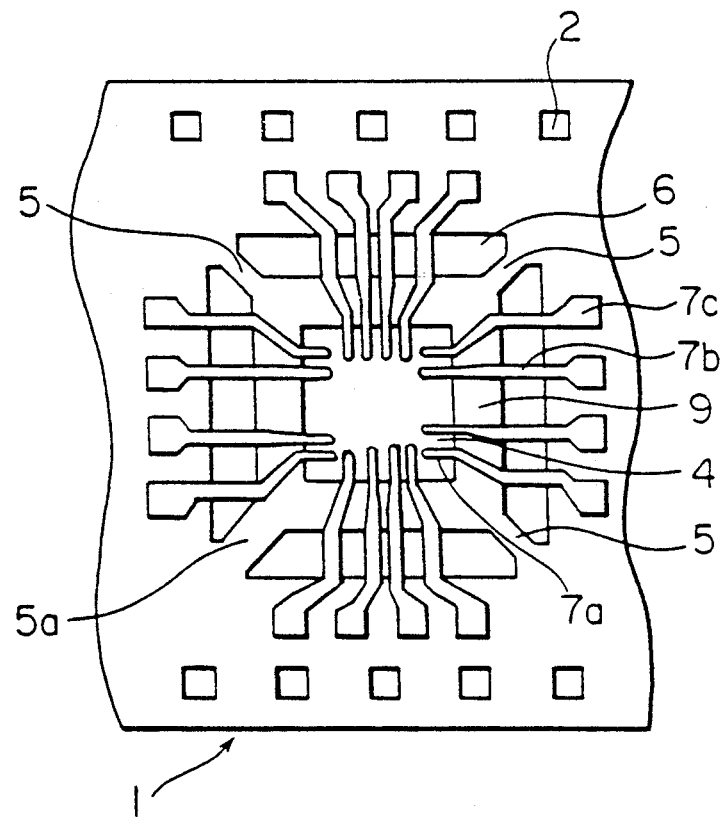
FIG. 1 is a plan view of a carrier tape in accordance with a first embodiment of the present invention.

In FIG. 1, a carrier tape included a flexible film 1 made of an insulating material, such as polyimide resin, and a plurality of leads 7 made of a conductive material such as copper. The film 1 included a plurality of perforations 2 regularly arranged along its opposite sides, a rectangular opening 4 at its center, and a plurality of outer lead holes 6 disposed around the periphery of the opening 4. The leads 7 are supported by a support portion 9 lying between the opening 4 and the outer lead holes 6. The inner ends or tips of the leads 7 extend into the opening 4 as inner leads 7a. Central portions of the leads 7 are positioned above the outer lead holes 6 as outer leads 7b. The rear ends of the leads 7 are test pads 7c. The film 1 has bridging portions 5 between adjacent outer lead holes 6 for securing the support portions 9 to the outer or remaining portion of the film 1. Specifically, one of the bridging portions 5 is wider than the others as a resin running portion 5a.

Next, a method of resin-molding a semiconductor chip mounted on the carrier tape of the above-described structure according to the present invention will be described below.

Figure 2A:
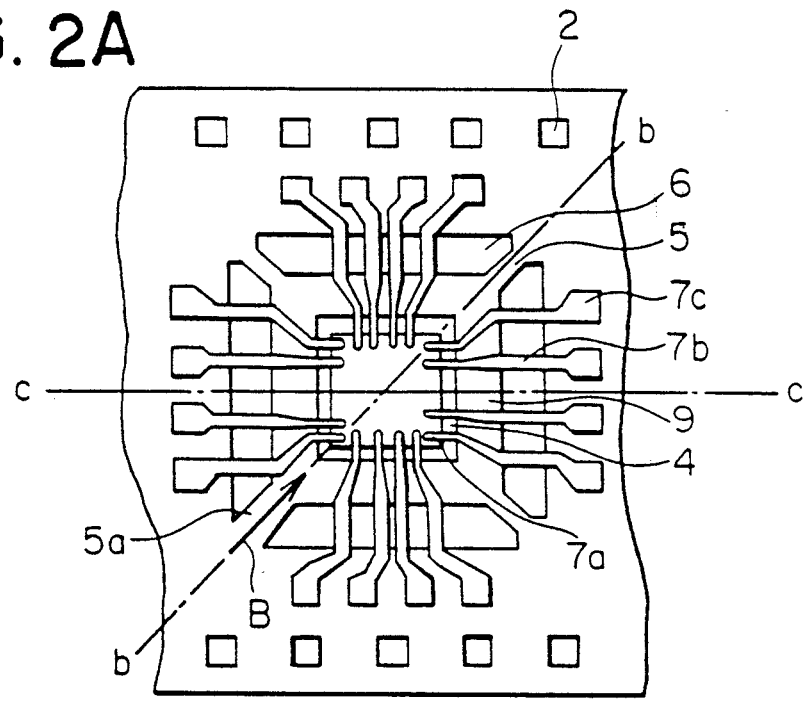
FIGS. 2A to 2C schematically show a process for resin-molding a semiconductor chip according to the present invention, FIG. 2A being a plan view of a carrier tape, FIG. 2B being a cross-sectional view of the carrier tape set in a mold taken along the line b—b of FIG. 2A, and FIG. 2C being a cross-sectional view of a resin-molded semiconductor device taken along the line c—c of FIG. 2A.
Figure 2B:
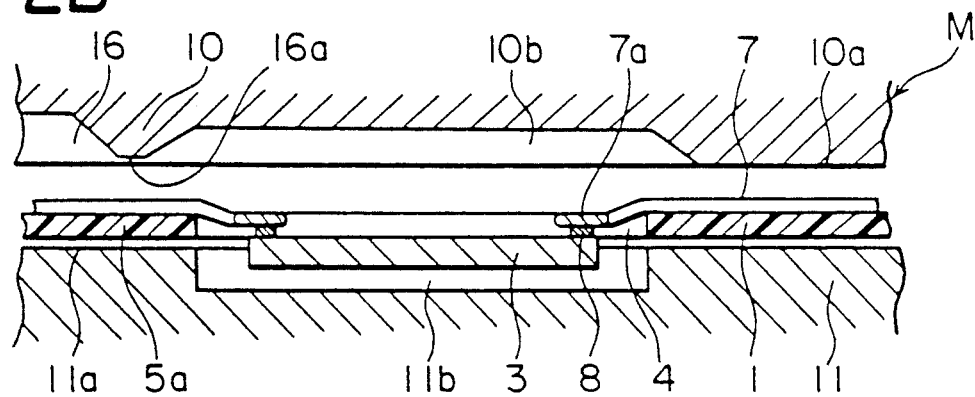

As shown in FIG. 2A, a semiconductor chip 3 is first introduced into the opening 4 in the film 1, and the bumps 8 disposed on electrodes of the semiconductor chip 3 are connected to the inner leads 7a projecting into the opening 4 by a thermocompression bonding method. Subsequently, the semiconductor chip 3 is positioned in a mold M as shown in FIG. 2B. The mold M comprises an upper mold half 10 and a lower mold half 11. These mold halves 10 and 11 have upper and lower parting surfaces 10a and 11a facing each other and upper and lower cavity halves 10b and 11b formed on the parting surfaces 10a and 11a, respectively. A resin runner 16 for introducing a resin between the confronting cavity halves 10b and 11b is disposed in the upper mold half 10. The resin runner 16 is a groove which opens to the upper parting surface 10a and is connected to the lower cavity half 10b via a gate 16a. There is a gap between the top surface of the gate 16a and the parting surface 10a of the upper mold half 10.

In FIG. 2B, the film 1 is placed onto the parting surface 11a of the lower mold half 11 while the semiconductor chip 3 is accommodated in the cavity half 11b in the lower mold half 11. The upper mold half 10 and the lower mold half 11 are then brought together to close the mold M, whereby the film 1 is placed between the parting surfaces 10a and 11a of the upper and lower mold halves 10 and 11. At this time, the resin runner 16 is closed at the bottom thereof by the surface of the film 1 while the gate 16a is located just above the resin running portion 5a of the film 1 and is closed at the bottom thereof by the resin running portion 5a of the film 1, whereby a tubular resin running path is formed between the upper mold half 10 and the film 1. The resin running path thus formed is not connected to any of the outer lead holes 6.

In this state, a resin 14 such as epoxy resin is injected into the cavity halves 10b and 11b through the resin running path by a low pressure transfer molding method to resin the semiconductor chip 3. Since the resin running path is not connected to any of the outer lead holes 6 as described above, the resin 14 is prevented from entering the outer lead holes 6. That is, the resin 14 is introduced into the cavity halves 10b and 11b only along the path indicated by arrow B as shown in FIG. 2A.

Figure 2C:
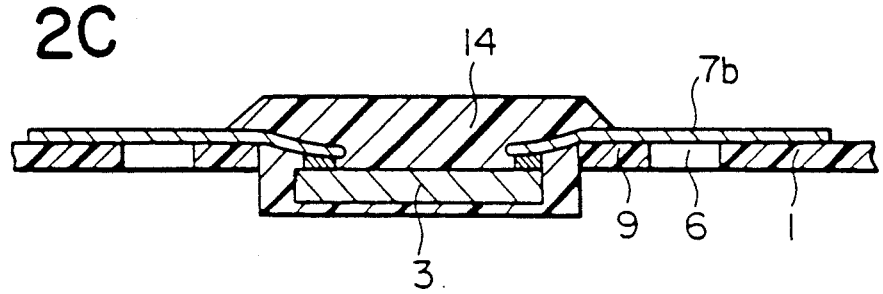
Figure 4A:
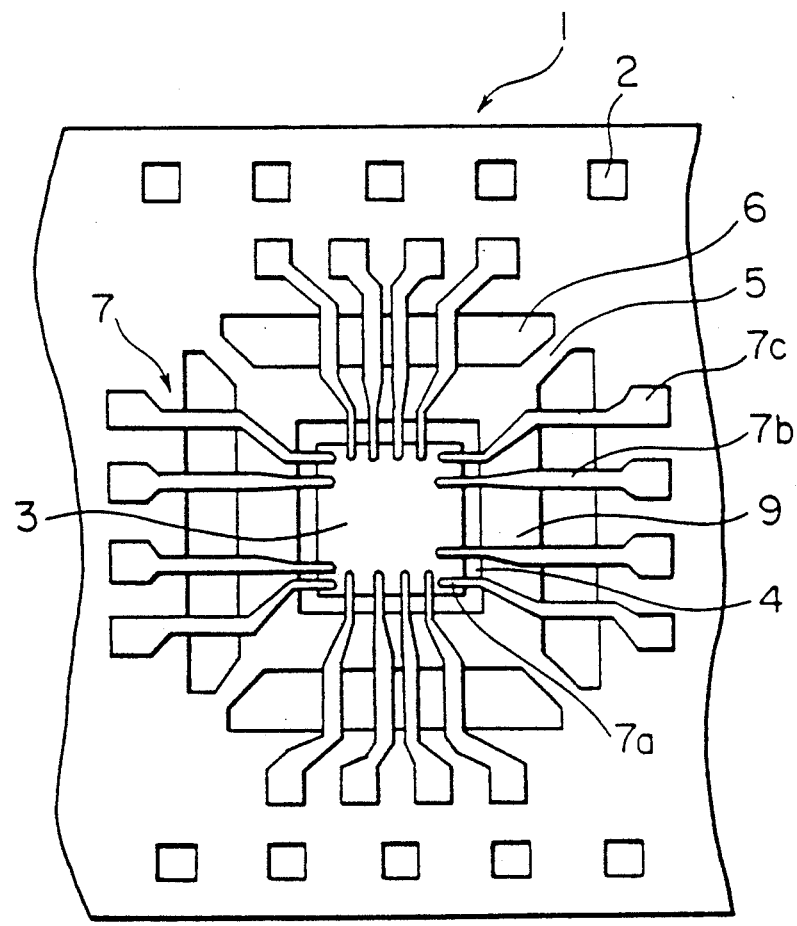
FIGS. 4A and 4B are plan and cross-sectional views, respectively, of a conventional carrier tape on which a semiconductor chip is mounted.
Figure 4B:
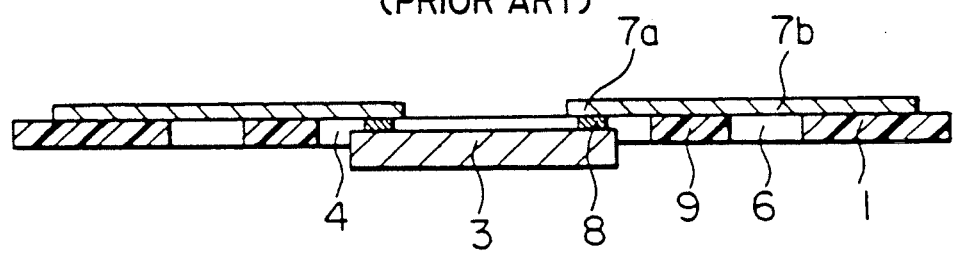
Figure 5A:
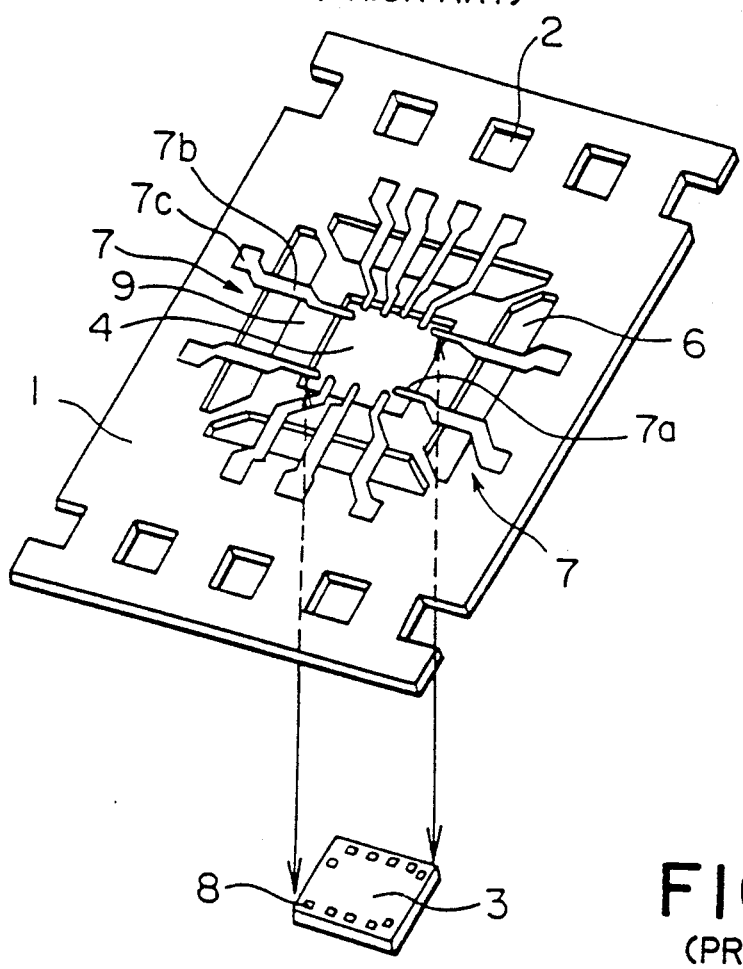
FIGS. 5A and 5B are perspective views of a conventional process of mounting a semiconductor chip to a carrier tape.
Figure 5B:
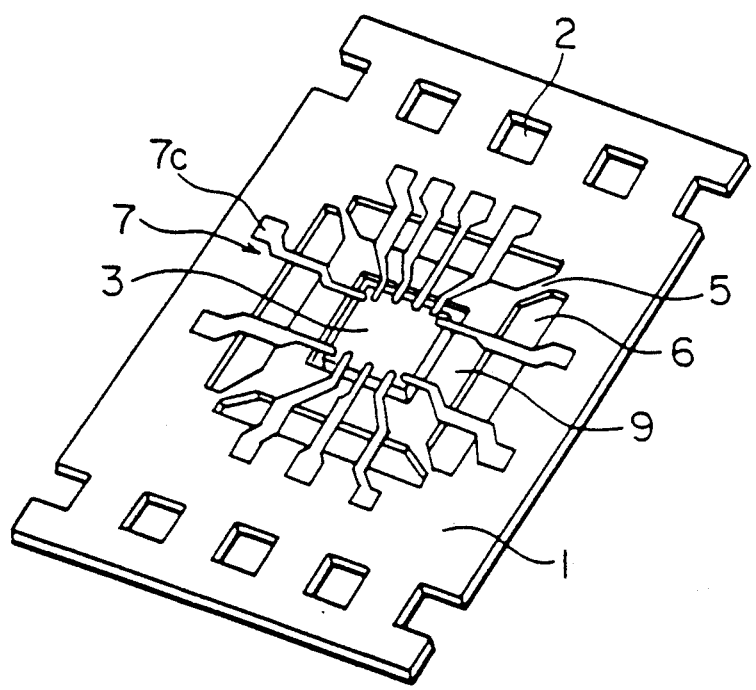
Figure 6A:
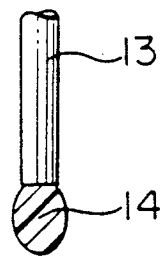
FIGS. 6A and 6B are schematic views illustrating one conventional process of resin-molding a semiconductor chip.
Figure 6A:
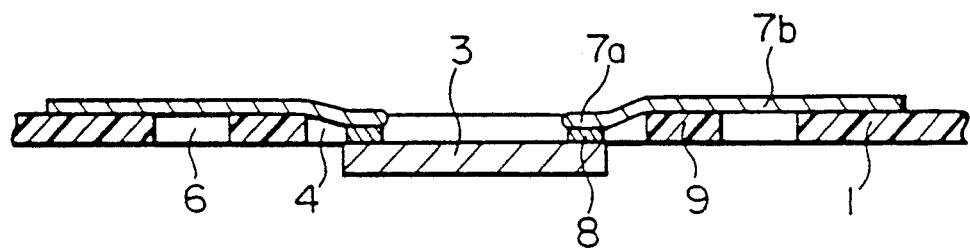
Figure 6B:
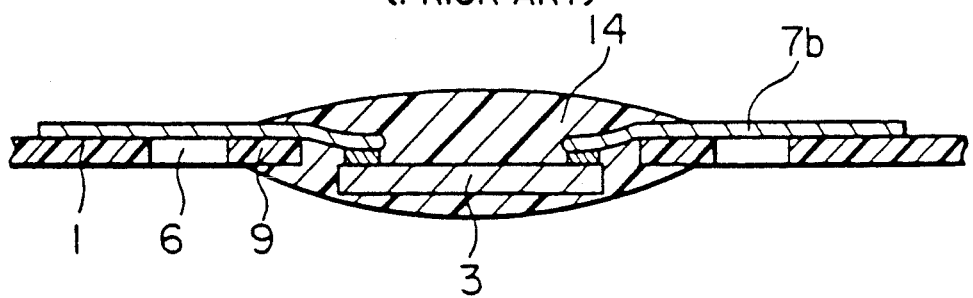
Figure 7A:
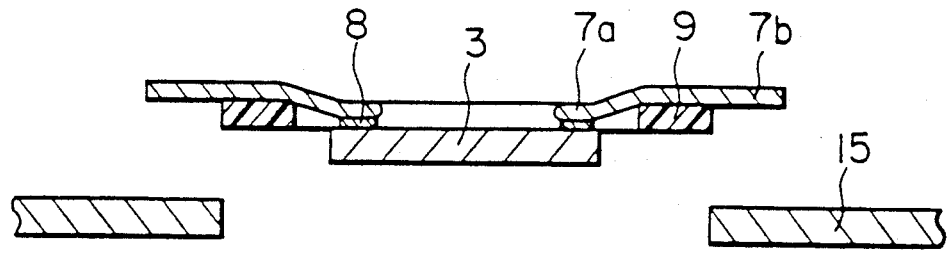
FIGS. 7A to 7D are schematic views illustrating another conventional process of resin-molding a semiconductor chip.
Figure 7B:
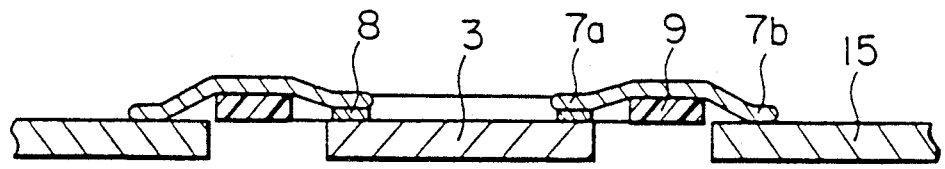
Figure 7C:
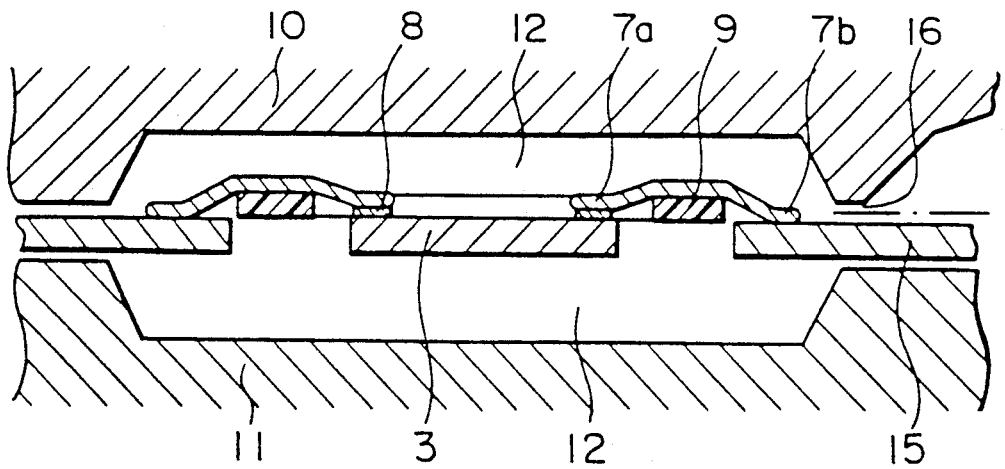
Figure 7D:
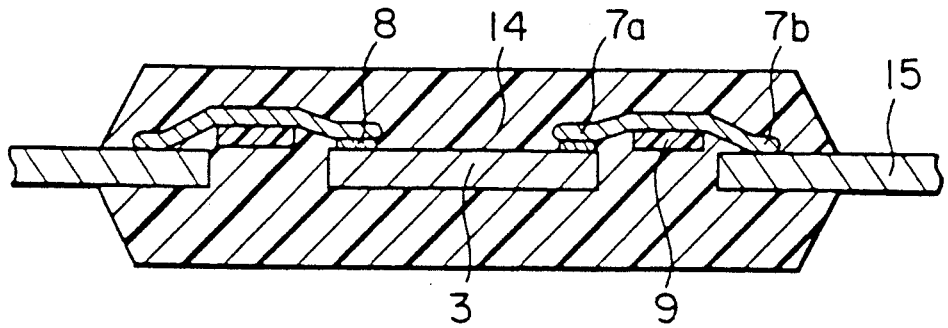
Figure 8A:
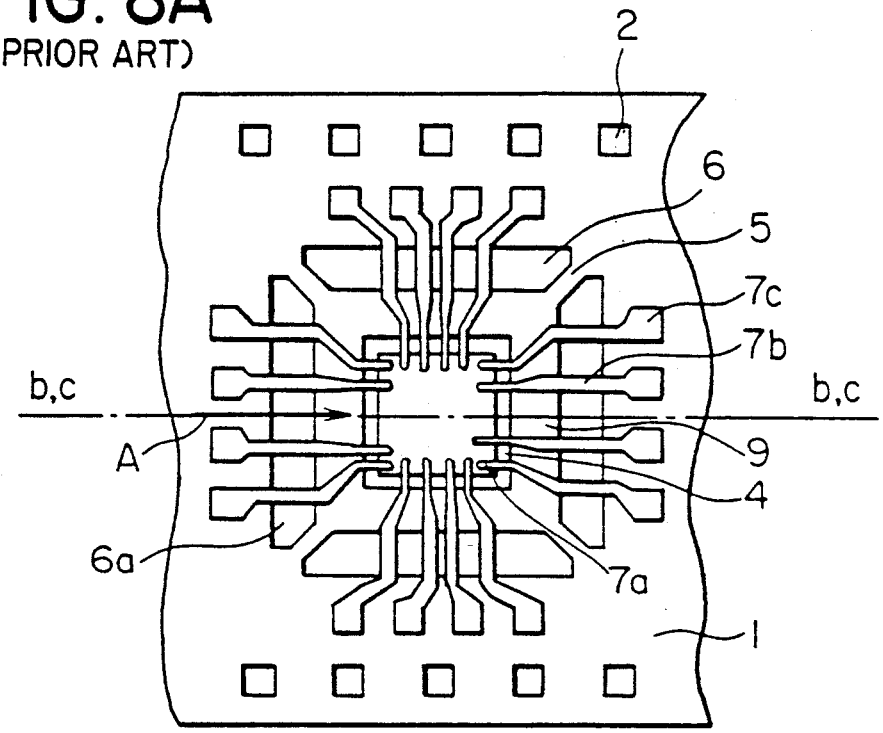
FIGS. 8A to 8C schematically show still another conventional process of resin-molding a semiconductor chip, FIG. 8A being a plan view of a carrier tape, FIG. 8B being a cross-sectional view of the carrier tape set in a mold taken along the line b—b of FIG. 8A, and FIG. 8C being a cross-sectional view of a resin-molded semiconductor device taken along the line c—c of FIG. 8A.
Figure 8B:
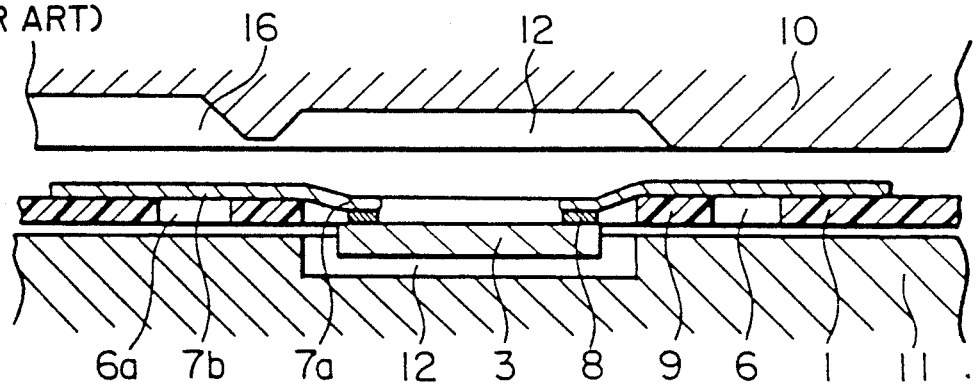
Figure 8C:
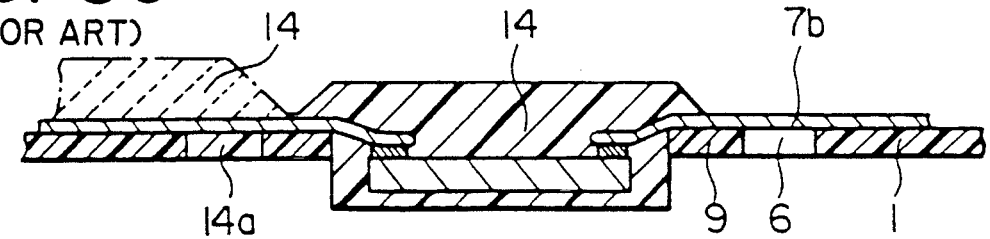

Thereafter, the resin 14 molding the semiconductor chip 3 is solidified, and a resin-molded semiconductor device, as shown in FIG. 2C, is then taken out of the mold M as a product.

Figure 3:
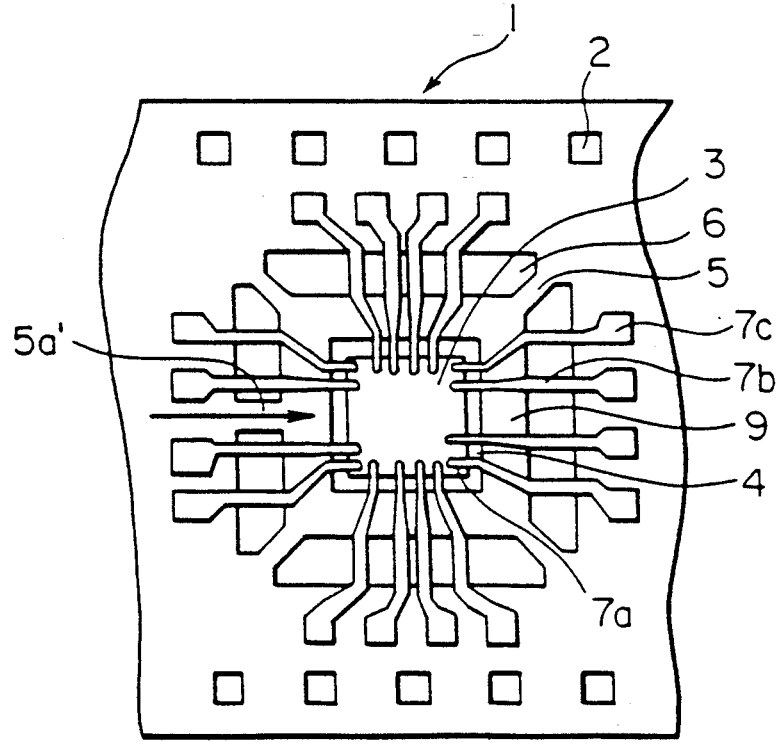
FIG. 3 is a plan view of a carrier tape on which a semiconductor chip is mounted in accordance with a second embodiment of the present invention.

Although in the above-described embodiment one of the bridging portions 5 is made wider than the others as a resin running portion 5a, a resin running portion 5a' may be formed across the center of one of the outer lead holes 6 separate from the bridging portions 5, as shown in FIG. 3.

As described in the foregoing, according to the present invention, it is possible to prevent the intrusion of the resin 14 into the outer lead holes 6 so that resin burrs will not be formed in the outer lead holes 6. Accordingly, the process of removing the resin burrs from the outer lead holes 6 after resin-molding of the semiconductor chip 3 is not necessary and there is no risk of damage to the outer leads 7b upon removal of the resin burrs.

In the above described embodiments, the resin running portion 5a or 5a' is formed of a part of the film 1. This, however, is not exclusive and it may be formed of a material different from that of the film 1. In addition, the resin running portion 5a or 5a' may take any appropriate configuration other than the one illustrated in the drawings.

What is claimed is:

1. A carrier tape for semiconductor devices comprising:

an insulating film including a central opening for receiving a semiconductor chip to be resin-molded, a plurality of outer lead holes disposed around the periphery of the central opening, a supporting portion lying between and defined by the central opening and outer lead holes, and a plurality of bridging portions disposed between respective outer lead holes connecting the supporting portion with the film beyond the outer lead holes; and a plurality of leads, each having a first end mounted on said film and an opposing second end extending over one of the outer lead holes into the central opening for connection to an electrode of a semiconductor chip disposed in the central opening wherein each of said bridging portions has a width between adjacent outer lead holes, one of said bridging portions having a larger width than the other bridging portions for forming, with resin mold halves, a resin running path extending along the wider bridging portion from said film beyond the outer lead holes to the central opening for preventing molten resin from entering the outer lead holes during resin molding of a semiconductor chip disposed in the central opening.

* * * * *